United States Patent
Pavisic et al.

(10) Patent No.: US 6,292,924 B1
(45) Date of Patent: *Sep. 18, 2001

(54) MODIFYING TIMING GRAPH TO AVOID GIVEN SET OF PATHS

(75) Inventors: Ivan Pavisic, Cupertino, CA (US); Anatoli A. Bolotov, Moskva; Alexander E. Andreev, Moskovskaja Oblast, both of (RU); Ranko Scepanovic, San Jose, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/964,997

(22) Filed: Nov. 5, 1997

(51) Int. Cl.⁷ .................................................. G06F 17/50
(52) U.S. Cl. ...................................... 716/1; 716/6
(58) Field of Search ................ 395/500.07, 500.04, 395/500.03; 716/1, 2, 3, 6

(56) References Cited

U.S. PATENT DOCUMENTS

| | | | |
|---|---|---|---|
| 5,448,497 | * | 9/1995 | Ashar et al. ............ 395/500.07 |
| 5,457,638 | * | 10/1995 | Ashar et al. ............ 395/500.07 |
| 5,508,937 | * | 4/1996 | Abato et al. ............ 395/500.07 |
| 5,659,486 | * | 8/1997 | Tamiya ................... 395/200.75 |

* cited by examiner

Primary Examiner—Matthew Smith
Assistant Examiner—Vuthe Siek
(74) Attorney, Agent, or Firm—Mitchell, Silberberg & Knupp LLP

(57) ABSTRACT

Integrated circuit chips (IC's) require proper placement of many cells (groups of circuit components) and complex routing of wires to connect the pins of the cells. Designing of the IC's require meeting real-world constraints such as minimization of the circuit area, minimization of wire length within the circuit, and minimization of the time the IC requires to perform its function, referred to as the IC delay. In order to design circuits to meet a given set of requirements, each signal path of the circuit must be analyzed. Because of the large number of the cells and the complex connections, the number of paths is very large and requires much computing power to analyze. Also, some of the paths are not important for the purposes of the operations of the chip and can be discounted during the analysis process. The present invention discloses a method and apparatus used to avoid analyzing non-important paths, referred to as false paths of a directed timing graph. To avoid the false paths, the timing graph representing the circuit is modified to exclude the false paths before the graph is analyzed. To modify the timing graph, duplicate nodes are constructed, duplicate edges are constructed, and some edges of the original graph are cut and replaced by mixed edges connecting non-duplicate nodes to duplicate nodes. Finally, mixed edges are created to connect duplicate nodes to non-duplicate nodes, integrating the duplicate graph with the original graph.

13 Claims, 2 Drawing Sheets

US 6,292,924 B1

MODIFYING TIMING GRAPH TO AVOID GIVEN SET OF PATHS

BACKGROUND OF THE INVENTION

1. Field of the Invention

The present invention generally relates to the art of microelectronic integrated circuits. In particular, the present invention relates to the art of placing and connecting cells on integrated circuit chips.

2. Description of Related Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip. For example, FIG. 1A shows a grossly simplified IC 10 having four cells 12, 14, 16, and 18 and ten pins 22, 24, 26, 28, 30, 22, 34, 36, 38, and 40. For simplicity, the cells will be denoted $C_{nn}$ and the pins will be denoted $p_{nn}$ where nn is the reference number of the cell or the pin used in the figure.

A net is a set of two or more pins which must be connected. Because a typical chip has thousands, tens of thousands, or hundreds of thousands of pins, which must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins. Some nets may include hundreds of pins to be connected. The IC 10 of FIG. 1A has two nets. The first net is a two-pin net comprising pins $p_{34}$ and $p_{40}$. The second net is a three pin net comprising pins $p_{32}$, $p_{36}$, and $p_{38}$. A net can be denoted as a set of pins net $(p_1, p_2, \ldots p_n)$ A netlist is a list of nets for a chip.

Typically, an IC has a plurality of input pins and a plurality of output pins. The inputs are digital electrical signals being provided to the IC to be operated on. The outputs are digital electrical signals resulting from the operations of the IC. In between the input pins receiving the input signals to the IC and the output pins providing the output signals, the digital signals are operated on by a plurality of cells connected to each other. The connections of the cells are defined by the nets discussed hereinabove. The IC 10 of FIG. 1A has three input pins—$p_{22}$, $p_{24}$, and $p_{26}$—and two output pins—$p_{28}$ and $P_{30}$. For the purposes of describing the present invention, the pins of the IC which are neither input pins nor output pins will be referred to as intermediate pins.

One of the major constraints in design and fabrication of IC's is the time the IC requires to perform the specified function. This is often referred to as the performance of the IC. To determine the performance of an IC, various time measurements must to be considered. This is because, in addition to the input and output lines, the IC may include internal registers, or flip-flops, which may store certain output values and provide a portion of input values to the logic circuits. The performance of an IC may be defined as the period of time between the instant the last of the input signals are available to the logic circuit (whether the signals are from the input lines or from internal registers) to the instant the latest of the output signals are available from the logic circuit (whether the signals are for the output lines or for internal registers). The instant the input signal are applied is often denoted as $t_0$. In any event, the performance of the IC is the period of time required for the logic circuits of the IC to performs its designed function irrespective of whether the inputs to the logic circuits are from the input pins or from the flip-flops or the outputs from the logic circuits are to the output pins or to the flip-flops. The performance of the IC is also referred to as the delay of the IC, or the IC delay.

For example, if the inputs to the IC 10 of FIG. 1A is applied at time $t_0$ and the last of the output signals of the IC is available at $t_0+3$ ns (nano-seconds), then the delay of the IC 10 is 3 ns. This is true even if the other outputs signals of the IC are available at $t_0+1$ ns or at $t_0+2$ ns.

The performance of the IC depends on many factors such as the physical characteristics of the material, the layout of the cells, etc. Some of these factors, such as the physical characteristics of the material of the IC, cannot be changed during the cell placement and routing process. On the other hand, the placement of the cells and the routing of the nets can be modified during the placement process to improve the performance of the IC.

In order to increase the performance of the IC by modifying the placement of the cells and re-routing the nets, the paths of the IC must be analyzed and the critical paths identified. A path is an alternating sequence of nodes and edges connecting them. A critical path is the path or the paths among all possible paths of an IC which causes the highest delay of the IC.

An edge is the direction of signals flow through the cells and the wires. There are two types of edges in an IC. A cell edge is the direction of signals flow through the cells of an IC, and is obtained by "connecting" an input pin of a cell with an output pin of the same cell. If a cell takes an input signal at pin pi and produces and output signal at pin $p_o$, then the cell edge for that signal flow is denoted $e_c(p_i, p_o)$. Then, $p_i$ is called a parent of $p_o$ and $p_o$ a child of $p_i$. For example, the IC 10 of FIG. 1A has several cell edges. The cell edges are $e_c(p_{22}, p_{32})$, $e_c(p_{24}, p_{34})$, $e_c(p_{26}, p_{34})$, $e_c(p_{36}, p_{38})$, $e_c(p_{38}, p_{30})$, and $e_c(P_{40}, p_{30})$ A pin may have none (for an input pin), one, or many parent(s), and none (for an output pin), one, or many children. If there is a path from node $p_1$, to node $p_2$, then $p_1$ is an ancestor of $p_2$ and $p_2$ is a descendant of $p_1$.

A net edge is the direction of signal flow from an output pin of a cell to an input pin of another cell, and is obtained by connecting the driver pin of a net with sink pin of the same net. A driver pin is the pin of a net which provides the signal to the sink pins of the same net and is typically an output pin of a cell. If a net has a driver pin $P_d$ which is connected to a sink pin $p_s$, then the net edge for that signal flow is denoted $e_n(p_d, p_s)$. A sink pin is a pin of a net which receives the signal from a driver pin, and is often an input pin of a cell. For example, the IC 10 of FIG. 1A has several net edges. The net edges are $e_n(p_{32}, p_{36})$, $e_n(p_{32}, p_{38})$, and $e_n(p_{34}, p_{40})$.

All edges of an IC are directed edges having a driver pin from which the signal originates and a sink pin to which the signal flows. For the purposes of the present invention, the distinction between the cell edges and net edges is not critical. Therefore, an edge will mean a cell edge or a net edge, and will be denoted $e(p_p, p_c)$ to indicate an edge between a parent pin $p_p$ and a child pin $p_c$.

A path may be denoted as a set of pins and edges, for example, path($p_1$, $e(p_1, p_2)$, $p_2$, $e(p_2, p_3)$, $p_3$, ...). An alterative expression of the path is to merely list the nodes, for example, path($p_1$, $p_2$, ...). Regardless of how it is denoted, a path comprises pins and edges connecting the pins.

The relationships of ancestor and descendent may exist between an edge and a node or between two edges. For example, if $p_1$, is an ancestor of $p_2$, then $p_1$ is also an ancestor of the edge $e(p_2, p_3)$. Similarly, if $p_7$ is a descendent of $p_4$, then $e(p_7, p_8)$ is a descendent of $p_4$.

FIG. 1B illustrates a directed graph constructed from the pins and the edges of the IC 10 of FIG. 1A. Each node of the graph 50 correspond to a pin of the IC 10 of FIG. 1, and each edge of the graph 50 correspond to an edge of the same IC 10. In FIG. 1B, the edges are directed. That is, each of the edges is indicated by an arrow to show the direction of the signal flow. In the present specification, the terms pins and the nodes will be used interchangeably unless otherwise specified.

Because each of the edges of the directed graph 50 of FIG. 1B represents a signal travel through a cell or through a wire, each of the edges can be assigned an edge delay to indicate the time required for a signal to travel from the parent pin to the child pin. Then, the directed graph is referred to as a directed timing graph or merely a timing graph. The delay of $e(p_1, p_2)$ is denoted delay($p_1, p_2$). It takes time for electrical signal to travel from pin to pin; thus, every edge has a delay.

The paths of the timing graph of an IC can be analyzed to locate the critical paths.

The timing characteristics of the cell edges can be obtained from libraries. However, the timing characteristics of net edges are not easily obtainable before the actual routing of the nets.

The period of time required for signals to travel from an input pin to pin p may be called the arrival time of pin p. The arrival time of node p, denoted arrival(p), is the latest time a signal from an input mode reaches node though any available path from an input node to the node. Formally, arrival(p) is $$arrival(p) = \max_{i=1-k} (arrival(p_i) + delay(p_i, p))$$

where $k$ is the number of parents of $p$; and $p$ is a child of $p_i$;

$p_1$ is a parent of $p$; and $arrival(p) = 0$ if $p$ is an input node.

To determine the performance, or the delay, of an IC, each of the paths of the IC must be analyzed. The IC delay may be expressed as the largest arrival time of any of the output nodes, or $$IC\ delay = \max_{j=1-m} (arrival(p_j))$$

where $m$ is the number of output pins of the IC;

$p_j$ is an output pin.

As discussed above, the IC delay is the period of time signals take to travel from an input pin to an output pin. Accordingly, it is not possible to determine the IC delay at an output pin without first determining the delay from the input pins to each of the intermediate pins the signal travels through to arrive at the output pin. In fact, for any pin not an input pin, arrival(p) cannot be determined unless the arrival (p) of all of its ancestors are first found.

For example, referring to FIG. 2, the IC delay of the chip represented by the timing graph 70 cannot be determined unless arrival($p_{90}$) and arrival($p_{92}$) are found. However, arrival($p_{92}$) cannot be found until arrival($p_{86}$) is first determined. Likewise, arrival($p_{86}$) cannot be found until arrival ($p_{82}$) and arrival($_{80}$) are found, and so on.

To find the delay of an IC, the arrival time of each of the pins of the IC must be determined. Because a typical IC contains many thousands or even millions of pins and paths, the analysis of arrival times for each of the pins are computationally expensive. Accordingly, the IC delay analysis of large IC circuits requires a large amount of time even when utilizing very powerful computers.

Additionally, IC's usually contain paths the delay of which should not be considered in the determination of the IC delay. These paths are called false paths. For example, self-test circuits of the IC may cause high IC delay. However, the self-test circuits are not used during the ultimate use of the IC, and the IC delay, as defined by the self-test, would be misleading. For instance, if the self-test circuits causes the IC to have the IC delay of 20 ns where the other, more relevant portions of the IC has the delay of 5 ns, then the IC delay of 20 ns is misleading.

In short, to determine the delay of an IC, only the true paths of the IC should be considered. Calculation of the arrival times and the delays of the false paths wastes the processing time and provides misleading results for the IC.

SUMMARY OF THE INVENTION

Therefore, an object of the present invention is to provide for a method and apparatus to ignore the false paths of an IC for the purposes of analyzing IC timing graphs and determining IC delays.

The present invention provides for a method of modifying timing graph to avoid false paths, by modifying the timing graph to include all the paths except the false paths. The timing graph is modified by constructing duplicate nodes, duplicate edges, and mixed edges, and by replacing selected non-duplicate edges by mixed edges.

The present invention also provides for an integrated circuit for which the arrival time of its pins were determined by constructing a timing graph, modifying the timing graph to exclude false paths, and determining the arrival time of the non-duplicate and duplicate nodes of the modified timing graph.

The present invention also provides for an apparatus for of modifying timing graphs to avoid false paths. The apparatus has a processor and memory connected to the processor. The memory stores instructions for the processor to modify the timing graph to include all the paths except the false paths.

DETAILED DESCRIPTION OF THE PREFERRED EMBODIMENT(S)

Directed timing graph may be used to facilitate the analysis of the paths of an IC. The timing graph used in delay calculations is constructed from the netlist. Therefore, a timing graph must first be constructed from a given IC design in order for the circuit to be analyzed.

Figure 1A:
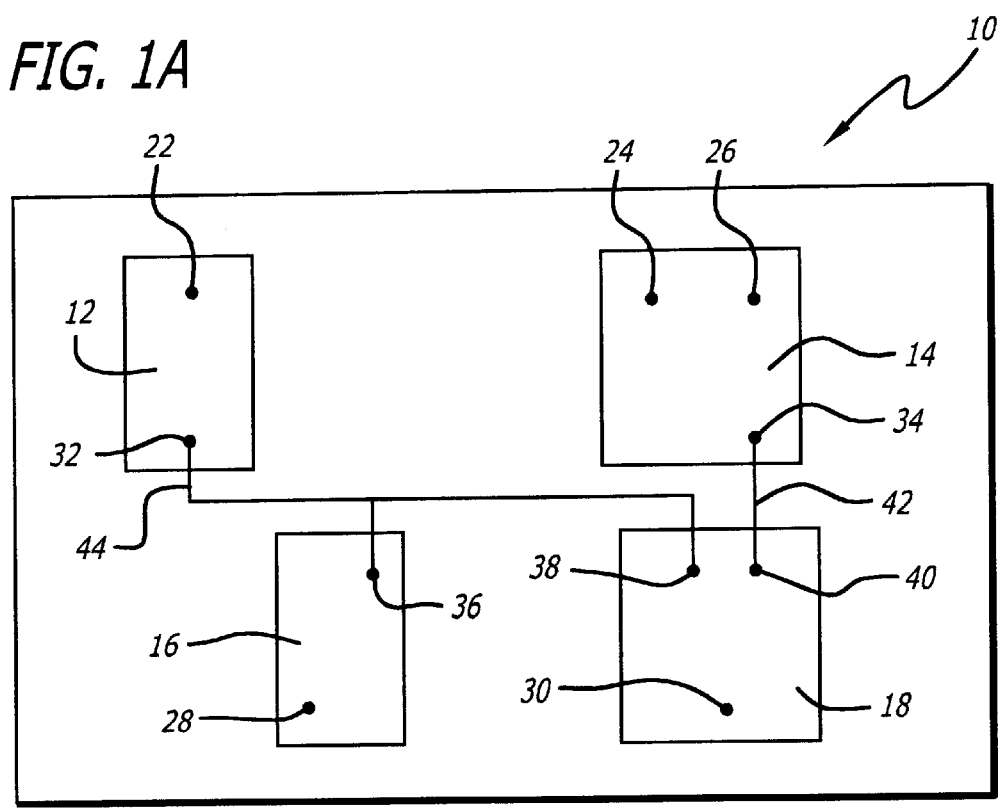
FIG. 1A is a simplified illustration of an integrated circuit chip.
Figure 1B:
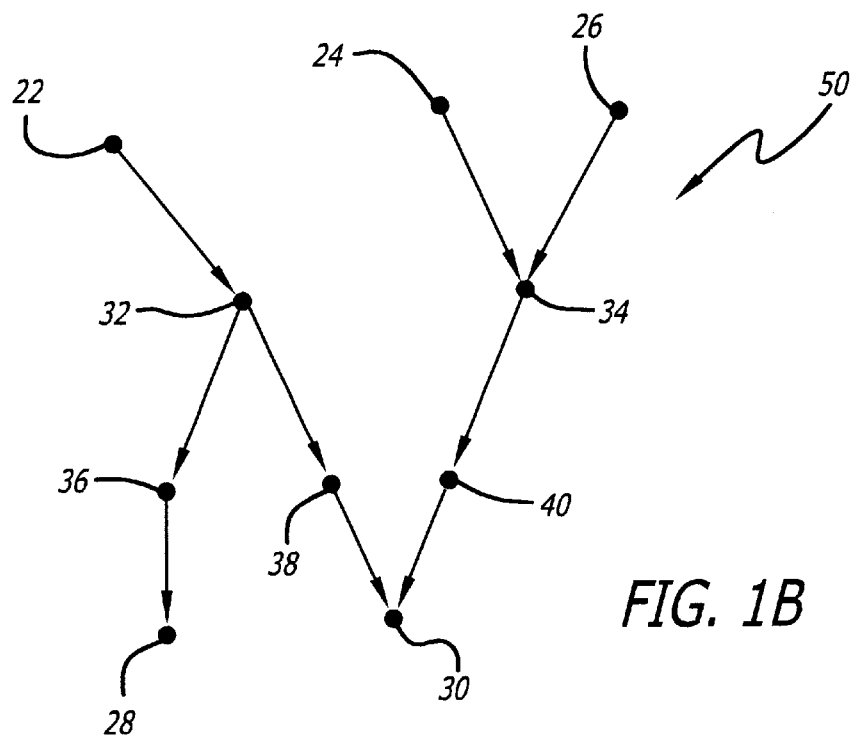
FIG. 1B is a timing graph derived from the integrated circuit chip of FIG. 1A.
Figure 2:
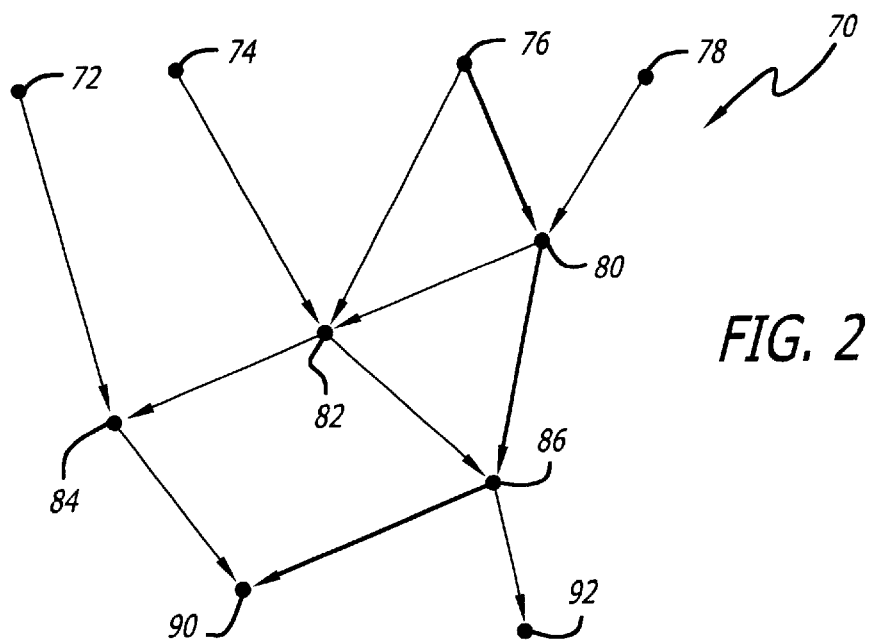
FIG. 2 is a sample directed timing graph.

Referring to FIG. 2, a sample timing graph 70 is illustrated. The timing graph 70 has input pins 72, 74, 76, and 78, output pins 90 and 92, and pins 80, 82, 84, and 86. For simplicity, the pins will be denoted $p_{nn}$ where nn is the reference number of the pin used in the figure. The graph 70 also has the following edges $e(p_{72}, p_{84})$, $e(p_{74}, p_{82})$, $e(p_{76}, p_{80})$, $e(p_{78}, p_{80})$, $e(p_{80}, p_{82})$, $e(p_{80}, p_{86})$, $e(p_{82}, p_{84}, p_{90})$, $e(p_{86}, p_{90})$, and $e(p_{86}, p_{92})$. In the present specification, the terms pins and the nodes will be used interchangeably unless otherwise specified.

For the purposes of the discussion, the following sample delay values are assigned to the edges of the graph 70 of FIG. 2:

TABLE 1

| Edges | Edge Delay (in nano seconds) |
|---|---|
| $e(p_{76}, p_{80})$, $e(p_{80}, p_{82})$ | 1.0 |
| $e(p_{78}, p_{80})$ | 0.8 |
| $e(p_{74}, p_{82})$, $e(p_{84}, p_{90})$ | 1.2 |
| $e(p_{72}, p_{84})$, $e(p_{76}, p_{82})$ | 1.4 |
| $e(p_{80}, p_{86})$ | 3.2 |
| $e(p_{82}, p_{84})$ | 1.8 |
| $e(p_{82}, p_{86})$ | 1.5 |
| $e(p_{86}, p_{90})$ | 2.6 |
| $e(p_{86}, p_{92})$ | 1.7 |

The arrival(p) is determined by analyzing each of the nodes of the graph. The resultant arrival times of the sample graph 70 is summarized by Table 2 below:

TABLE 2

| Node | Arrival time (0 = $t_0$, in ns) |
|---|---|
| $p_{72}$, $p_{74}$, $p_{76}$, $p_{78}$ | 0 |
| $p_{80}$ | 1.0 |
| $p_{82}$ | 2.0 via path($p_{76}$, $p_{80}$, $p_{82}$) |
| $p_{84}$ | 3.8 via path($p_{76}$, $p_{80}$, $p_{82}$, $p_{84}$) |
| $p_{86}$ | 4.2 via path($p_{76}$, $p_{80}$, $p_{86}$) |
| $p_{90}$ | 6.8 via path($p_{76}$, $p_{80}$, $p_{86}$, $p_{90}$) |
| $p_{92}$ | 5.9 via path($p_{76}$, $p_{80}$, $p_{86}$, $p9_2$) |

Because nodes $p_{90}$ and $p_{92}$ are the output nodes, the IC delay is the larger of the two which is 6.8 ns of $p_{90}$. This value may be denoted D. The critical paths are the paths leading to the highest arrival time at an output node. In the present example, the critical path is path($p_{76}$, $p_{80}$, $p_{86}$, $p_{90}$) requiring 6.8 ns for signal to traverse the path.

However, if path($p_{76}$, $p_{80}$, $p_{86}$, $p_{90}$) is a false path, then the IC delay of 6.8 ns is misleading because that path should not be used in determining the IC delay. Also, the calculation of path($p_{76}$, $p_{80}$, $p_{86}$, $p_{90}$) required computational resources.

To preclude the use of a false path delay as an IC delay, and to avoid the arrival time calculation of the false paths, the following technique may be used:

Identify the False Path Intervals

Very often, the false paths form groups that can be expressed as "all the paths starting in the set of nodes $N_1$, then going through the set of edges $E_1$, then through the set of nodes $N_2$," and so on. Such groups of paths can be called a path interval. Thus, a path interval is an alternating sequence of sets of nodes and sets of edges such that every element from $N_1$, is an ancestor of every element from any other sets of nodes or edges of the path interval. A path interval may comprise one or more paths to be ignored for the purposes of arrival time and IC delay determinations. Because all edges have a parent and a child node, a path interval always begins and ends with a set of nodes.

The arrival time of the nodes of the false paths can be easily ignored by grouping the false paths into path intervals. A path interval is denoted PI.

First, the false path interval must be clearly defined by determining the beginning nodes, finishing nodes, and the intermediate nodes of the false path interval. Assuming that the false path interval is defined as $$PI = \{N_1, E_1, N_2, E_2, \ldots, E_{n-1}, N_n\}$$

where $N_1$ is a set of beginning nodes, not necessarily the input nodes;

$E_1$ is a set of edges, each edge having a parent node belonging to $N_1$ and a child node belonging to $N_2$;

$N_2$ is a set of nodes, each node being a child node of an edge belonging to $E_1$; and so on until $N_n$ is a set of finishing nodes, each node being a child node of an edge belonging to $E_{n-1}$; the nodes of $N_n$ are not necessarily the output nodes.

Then, define

| | | |
|---|---|---|
| V(PI) | = | set of all nodes of the path interval PI |
| $V_{beg}$(PI) | = | $N_1$, set of all nodes comprising the top level nodes, or input nodes, of PI. These are not necessarily the input nodes of the timing graph; |
| $V_{fin}$(PI) | = | $N_n$, set of all nodes comprising the bottom level nodes, or output nodes of PI; These are not necessarily the output nodes of the timing graph; and |
| $V_{int}$(PI) | = | V(PI) − ($V_{beg}$(PI) ∪ $V_{fin}$(PI)), all other nodes of PI. |

And define

| | | |
|---|---|---|
| W(PI) | = | set of all edges of the path interval PI; |
| $W_{beg}$(PI) | = | set of edges having a parent node belonging in $V_{beg}$(PI); |
| $W_{fin}$(PI) | = | set of edges having a child node belonging in $V_{fin}$(PI); and |
| $W_{int}$(PI) | = | W(PI) − ($W_{beg}$(PI) ∪ $W_{fin}$(PI)), all other edges of PI. |

Referring again to FIG. 2, these definitions can be illustrated using the directed timing graph 70. Assuming that the path($p_{76}$, $p_{80}$, $p_{86}$, $p_{90}$) is a false path, a false path interval, PI, is defined as comprising a single false path, path($p_{76}$, $p_{80}$, $p_{86}$, $p_{90}$), then,

| | | |
|---|---|---|
| V(PI) | = | $\{p_{76}, p_{80}, p_{86}, p_{90}\}$ |
| $V_{beg}$(PI) | = | $\{p_{76}\}$ |

-continued

| | | |
|---|---|---|
| $V_{fin}(PI)$ | = | $\{p_{90}\}$ |
| $V_{int}(PI)$ | = | $\{p_{80}, p_{86}\}$ |
| $W(PI)$ | = | $\{e(p_{76}, p_{80}), e(p_{80}, p_{86}), e(p_{86}, p_{90})\}$ |
| $W_{beg}(PI)$ | = | $\{e(p_{76}, p_{80})\}$ |
| $W_{fin}(PI)$ | = | $\{e(p_{86}, p_{90})\}$ |
| $W_{int}(PI)$ | = | $\{e(p_{80}, p_{86})\}$ |

Modify the Graph

To modify the timing graph to preclude the analysis of the false paths grouped in a false path interval PI, the following operation are applied to the graph:

Step 1.

For each node in $V_{int}(PI)$, a duplicate node, denoted $p'_{nn}$, is constructed. As discussed above, a pin, or a node, is denoted pnn where nn is the reference number used in the figure to identify the node. For simplicity, the duplicate pin if $p_{nn}$ will be denoted $p'_{nn}$ where nn' is the reference number used in the figure to identify the duplicate pin. Pin $p'_{nn}$ is the duplicate of non-duplicate pin $p_{nn}$.

For uniformity of terminology, the nodes of the original graph 70 of FIG. 2 will be referred to as non-duplicate nodes or non-duplicate pins. Similarly, edges connecting non-duplicate nodes will be referred to as non-duplicate edges. Edges connecting duplicate nodes will be referred to as duplicate edges. Edges connecting a duplicate pin and a non-duplicate pin will be referred to as a mixed edge. A duplicate node corresponds to the non-duplicate node to which it is the duplicate of. For instance, node $p'_{80}$ corresponds to node $P_{80}$. Similarly, a duplicate edge or a mixed edge corresponds to the non-duplicate edge if the node or the nodes defining the duplicate or mixed edge corresponds to the node or nodes of the non-duplicate edge. For example, $e(p'_{80}, p'_{86})$ corresponds to $e(p_{80}, p_{86})$, and $e(p'_{86}, p_{92})$ corresponds to $e(p_{86}, p_{92})$. The sets of duplicate nodes, duplicate edges, and mixed edges comprise a duplicate graph. Note that a duplicate graph does not completely copy the original timing graph, but copies only a portion of the original timing graph.

Step 2.

For every edge $e(p_i, p_j)$ in $W_{beg}(PI)$, if the child node, $p_j$, is a member of $V_{int}(PI)$, then the edge $e(p_i, p_j)$ is deleted and a new edge $e(p_i, p'_j)$ is constructed. Node p'j exists for the edge because it was constructed during Step 1. Note that pi is a member of $V_{beg}(PI)$. The edges of $W_{beg}(PI)$ is also referred to as the top level edges of PI.

Step 3.

For every edge $e(p_m, p_n)$ in $W_{int}(PI)$, a duplicated edge $e(p'_m, p'_n)$ is constructed.

Step 4.

For every edge $e(p_j, p_k)$, if the parent node, pj, is a member of $V_{int}(PI)$ and the child node, pk, is not a member of V(PI), then a new edge $e(p'_j, p_k)$ is added.

The modification of the graph is now complete, and the new, modified timing graph may be used to calculate the arrival time of the pins and the IC delay of the circuit. The edge delay between a non-duplicate pin and a duplicate pin is same as the edge delay between the non-duplicate pin and the non-duplicate pin to which the child pin is the duplicate of. More formally, $delay(p_i, p_j) = delay(p_i, p'_j)$ where $p'_j$ is a duplicate of $p_j$.

Also, $delay(p_i, p_j) = delay(p'_i, p_j)$; and $delay(p_i, p_j) = delay(p'_i, p'_j)$.

To calculate the IC delay of the circuit represented by the modified timing graph, all the nodes, including the non-duplicate and the duplicate nodes, must be analyzed for the arrival times.

FIG. 2 shows the timing graph 70 which has a false path path($p_{76}, p_{80}, p_{86}, p_{90}$) As analyzed above, the false path, if not ignored, defines the IC delay of the circuit represented by the graph 70 because the false path includes an output pin with the highest arrival time. In this example, there is only one false path, so the false path interval, PI is a one member set comprising path($p_{76}, p_{80}, p_{86}, p_{90}$)

Figure 3:
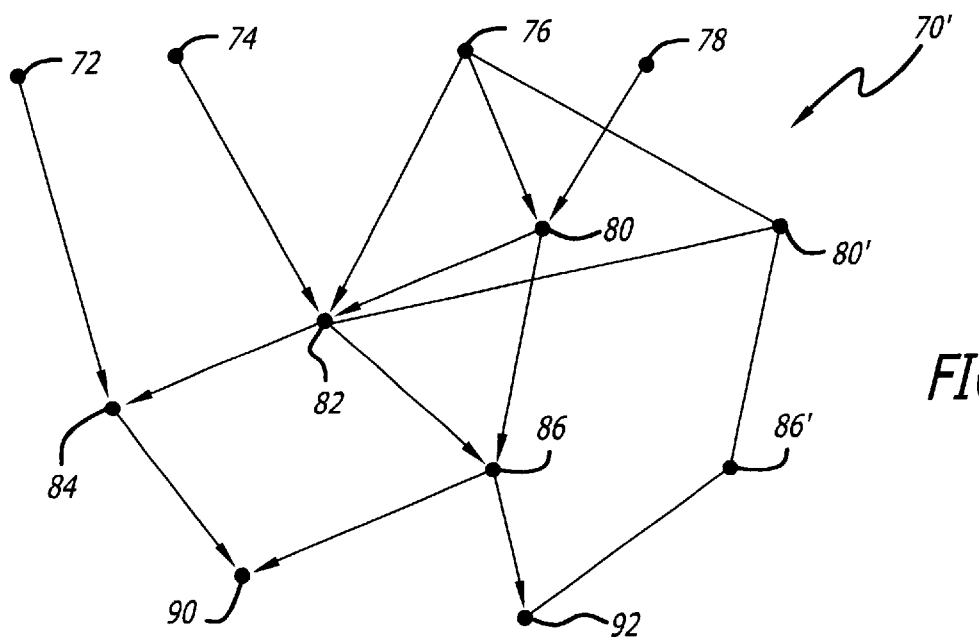
FIG. 3 is the sample directed timing graph of FIG. 2 after it has been modified in accordance with the technique of the present invention.

FIG. 3 shows a timing graph 70' which is the timing graph 70 of FIG. 2 after it has been modified in accordance with the steps outlined above. Note that in the modified graph 70', the false path path($p_{76}, p_{80}, p_{86}, p_{90}$) does not exist, but all other paths exists.

Beginning with the graph 70 of FIG. 2, Step 1 is applied to the graph 70 by constructing duplicate pins $p_{80}$ and $p'_{86}$ because $p_{80}$ and $p_{86}$ are members of $V_{int}(PI)$.

Step 2 requires the deletion of $e(p_{76}, p_{80})$ and addition of $e(p_{76}, p'_{80})$. Note that $e(p_{76}, p_{80})$ is a member of $W_{beg}(PI)$, and $p_{80}$ is a member of $V_{int}(PI)$.

In the present example, the set $W_{int}(PI)$ comprises only one edge $e(p_{80}, p_{86})$. Thus, in accordance with Step 3, a duplicate edge, $e(p'_{80}, p'_{86})$ is constructed.

Finally, the application of Step 4 requires the addition of edges $e(p'_{80}, p_{82})$ and $e(p'_{86}, p_{92})$. Note that for each of the edges $e(p_{80}, p_{82})$ and $e(p_{86}, P_{90})$, the parent nodes were members of $V_{int}(PI)$, and the child nodes were not members of V(PI).

The resultant directed timing graph 70' of FIG. 3 has all the nodes and the edges of the initial graph 70 except the false paths as defined by the false path interval PI.

Because the edge delay between a non-duplicate pin and a duplicate pin, and the edge delay between duplicate pins are same as the edge delay between the corresponding non-duplicate pins, the delays of the edges of the new timing graph can be summarized as listed by Table 3 below.

TABLE 3

| Edges | Edge Delay (in nano seconds) |
|---|---|
| $e(p_{76}, p'_{80})$, $e(p_{80}, p_{82})$, $e(p'_{80}, p_{82})$ | 1.0 |
| $e(p_{78}, p_{80})$ | 0.8 |
| $e(p_{74}, p_{82})$, $e(p_{84}, p_{90})$ | 1.2 |
| $e(p_{72}, p_{84})$, $e(p_{76}, p_{82})$ | 1.4 |
| $e(p_{80}, p_{86})$, $e(p'_{80}, p'_{86})$ | 3.2 |
| $e(p_{82}, p_{84})$ | 1.8 |
| $e(p_{82}, p_{86})$ | 1.5 |
| $e(p_{86}, p_{90})$ | 2.6 |
| $e(p_{86}, p_{92})$, $e(p'_{86}, p_{92})$ | 1.7 |

The modified graph 70' no longer contains the false path path($p_{76}, p_{80}, p_{86}, p_{90}$) However, the graph 70' includes paths traversing duplicate nodes and duplicated edges. The arrival(p) for the nodes of the new graph 70' is summarized by Table 4 below:

TABLE 4

| Node | Arrival time (0 = $t_0$, in ns) |
|---|---|
| $p_{72}, p_{74}, p_{76l}, p_{78}$ | 0, input nodes |
| $p_{80}$ | 0.8 |
| $p'_{80}$ | 1.0 |
| $p_{82}$ | 2.0 via path($p_{76}, p'_{80}, p_{82}$) |
| $p_{84}$ | 3.8 via path($p_{76}, p'_{80}, p_{82}, p_{84}$) |
| $p_{86}$ | 4.0 via path($p_{78}, p_{80}, p_{86}$) |
| $p'_{86}$ | 4.2 via path($p_{76}, p'_{80}, p'_{86}$) |

TABLE 4-continued

| Node | Arrival time (0 = $t_0$, in ns) |
| --- | --- |
| $p_{90}$ | 6.6 via path($p_{78}$, $p_{80}$, $p_{86}$, $p_{90}$) |
| $p_{92}$ | 5.9 via path($p_{76}$, $p'_{80}$, $p'_{86}$, $p_{92}$) |

Note that the new IC delay value for the circuit represented by the graph 70' is 6.6 ns via path path($p_{78}$, $p_{80}$, $p_{86}$, $p_{90}$). One could have expected the IC delay of the circuit, after the removal of the false path, to be 5.9 ns via path($p_{76}$, $p_{80}$, $p_{86}$, $p_{92}$). Such expectation is based on the fact that path($p_{76}$, $p_{80}$, $p_{86}$, $p_{92}$) was the path with the second longest delay according to the original graph 70. See FIG. 2 and Table 2. However, the removal of the false path allowed a true path with a delay higher than 5.9 ns to be detected. This true path, path($p_{78}$, $p_{80}$, $p_{86}$, $p_{90}$), was "hidden" by the false path until the false path was removed. Therefore, another advantage of the present invention is that, by removing false paths, the true paths are uncovered for a better analysis of the circuit.

Apparatus for Modifying Timing Graphs to Avoid False Paths

Figure 4:
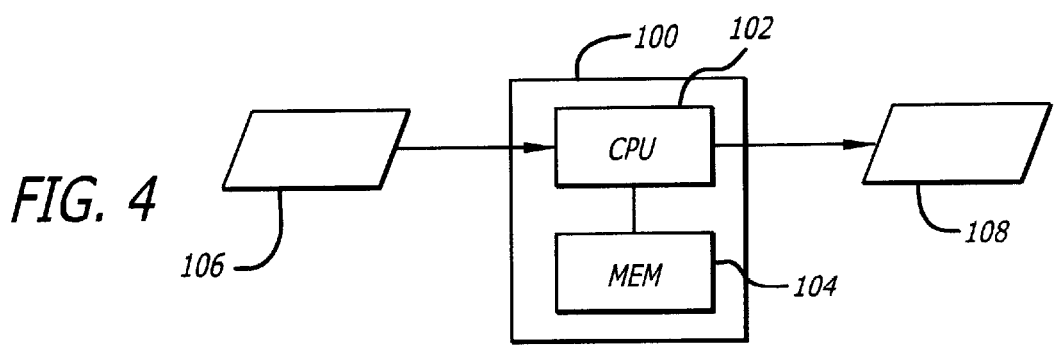
FIG. 4 is a block diagram illustrating an apparatus according to a preferred embodiment of the present invention.

Now referring to FIG. 4, a computing apparatus 100 for modifying timing graphs to avoid false paths is illustrated. The apparatus comprises a processor 102 and memory 104 connected to the processor. The memory 104 stores instructions for the processor 102 for the processor 102 to modify the timing graph to include all the paths except the false paths.

The memory 104 may be any kind of machine-readable storage medium containing the instructions for the processor to read input information 106, modify the timing graph, and produce an output 108. For the present invention, the input 106 may comprise the original timing graph, in which case, the memory 104 comprises instructions for the processor 102 to modify the timing graph and to produce, as the output 108, the modified timing graph. If the input 106 is a circuit design, the memory 104 comprises instructions for the processor 102 to construct a timing graph, modify the timing graph, and determine the arrival times of the pins of the circuit to produce, as the output 108, the arrival times of the pins of the circuit. It is well known in the art that the memory may be formed as a semiconductor memory device, magnetic device, optical device, magneto-optical device, floppy diskette, hard drive, CD-ROM, magnetic tape, computer memory, or memory card.

Although the present invention has been described in detail with regarding the exemplary embodiments and drawings thereof, it should be apparent to those skilled in the art that various adaptations and modifications of the present invention may be accomplished without departing from the spirit and the scope of the invention. Accordingly, the invention is not limited to the precise embodiment shown in the drawings and described in detail hereinabove. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method of calculating a circuit delay for a specified circuit, said method comprising steps of:
    obtaining a timing graph for the specified circuit, the timing graph including original nodes and original edges;
    identifying a false path in the timing graph, the false path being a path whose delay should not be considered in a determination of the circuit delay;
    identifying a sequence of original nodes and original edges in the timing graph that define the false path;
    adding duplicate nodes to the timing graph, wherein each duplicate node is a duplicate of one of the original nodes in said sequence;
    replacing an original edge that connects a first original node to a second original node in the sequence with a replacement edge that connects the first original node to the duplicate node that corresponds to the second original node; and
    calculating the circuit delay for the specified circuit using the timing graph as modified by said adding and replacing steps.

2. A method according to claim 1 further comprising the step of determining arrival time of said modified graph.

3. A method according to claim 1, wherein said modified timing graph has a path corresponding to each path in the timing graph other than the false path.

4. A method according to claim 1, further comprising a step of adding an other edge that connects an other of the duplicate nodes to a third original node.

5. A method according to claim 1, further comprising a step of adding a duplicate edge that corresponds to an original edge, wherein the duplicate edge connects to duplicate nodes that are duplicates of the original nodes connected by said original edge.

6. A method according to claim 1, wherein the original edge replaced in said replacing step is an initial edge in the false path.

7. A method for determining a circuit delay for a specified circuit, said method comprising steps of:
    constructing an original timing graph for the specified circuit, the original timing graph having original nodes and original edges;
    modifying said original timing graph to provide a modified timing graph that excludes a false path in the original timing graph, the false path being a path whose delay should not be considered in a determination of an overall delay, by:
      deleting an original edge in the false path;
      adding duplicate nodes to the original timing graph, wherein each duplicate node is a duplicate of one of the original nodes in the false path; and
      adding new edges connecting the duplicate nodes to the original nodes such that the modified timing graph has a path corresponding to each path in the original timing graph other than the false path; and
    determining the circuit delay for the specified circuit based on the modified timing graph.

8. A method according to claim 7, wherein the false path includes a beginning edge that connects a beginning node of the false path to a second node of the false path and an ending edge that connects a penultimate node of the false path to an ending node of the false path, and wherein said modifying step comprises:
    adding a duplicate node for each original node in the false path that is not the beginning node or the ending node of the false path;
    replacing the beginning edge of the false path with an edge that connects the beginning node of the false path to a duplicate node that is a duplicate of the second node of the false path;
    adding a new first edge corresponding to an original edge in the false path that does not include the beginning node or the ending node, wherein said new first edge connects two duplicate nodes that are duplicates of the original nodes connected by the corresponding original edge; and adding a new second edge corresponding to an original edge that connects a node in the false path that is not the beginning node or the ending node to a node that is not included in the false path.

9. An apparatus for calculating a circuit delay for a specified circuit, said apparatus comprising:

a processor; and a memory connected to said processor having instructions for said processor to:
  obtain a timing graph for the specified circuit, the timing graph including original nodes and original edges;
  identify a false path in the timing graph, the false path being a path whose delay should not be considered in a determination of the circuit delay;
  identify a sequence of original nodes and original edges in the timing graph that define the false path;
  add duplicate nodes to the timing graph, wherein each duplicate node is a duplicate of one of the original nodes in said sequence;
  replace an original edge that connects a first original node to a second original node in the sequence with a replacement edge that connects the first original node to the duplicate node that corresponds to the second original node; and
  calculate the circuit delay for the specified circuit using the timing graph as modified by said adding and replacing steps.

10. An apparatus for determining a circuit delay for a specified circuit, said apparatus comprising:

means for constructing an original timing graph for the specified circuit, the original timing graph having original nodes and original edges;

means for modifying said original timing graph to provide a modified timing graph that excludes a false path in the original timing graph, the false path being a path whose delay should not be considered in a determination of an overall delay, by:
  deleting an original edge in the false path;
  adding duplicate nodes to the original timing graph, wherein each duplicate node is a duplicate of one of the original nodes in the false path; and
  adding new edges connecting the duplicate nodes to the original nodes such that the modified timing graph has a path corresponding to each path in the original timing graph other than the false path; and means for determining the circuit delay for the specified circuit based on the modified timing graph.

11. A computer-readable medium encoded with a computer program for calculating a circuit delay for a specified circuit, said computer program comprising steps of:

obtaining a timing graph for the specified circuit, the timing graph including original nodes and original edges;

identifying a false path in the timing graph, the false path being a path whose delay should not be considered in a determination of the circuit delay;

identifying a sequence of original nodes and original edges in the timing graph that define the false path;

adding duplicate nodes to the timing graph, wherein each duplicate node is a duplicate of one of the original nodes in said sequence;

replacing an original edge that connects a first original node to a second original node in the sequence with a replacement edge that connects the first original node to the duplicate node that corresponds to the second original node; and calculating the circuit delay for the specified circuit using the timing graph as modified by said adding and replacing steps.

12. A computer-readable medium according to claim 11 wherein said medium is selected from a group consisting of: a semiconductor memory device, a magnetic device, an optical device, a magneto-optical device, a floppy diskette, a hard drive, a CD-ROM, a magnetic tape, a computer memory, and a memory card.

13. A computer-readable medium encoded with a computer program for determining a circuit delay for a specified circuit, said computer program comprising steps to:

construct an original timing graph for the specified circuit, the original timing graph having original nodes and original edges;

modify said original timing graph to provide a modified timing graph that excludes a false path in the original timing graph, the false path being a path whose delay should not be considered in a determination of an overall delay, by:
  deleting an original edge in the false path;
  adding duplicate nodes to the original timing graph, wherein each duplicate node is a duplicate of one of the original nodes in the false path; and
  adding new edges connecting the duplicate nodes to the original nodes such that the modified timing graph has a path corresponding to each path in the original timing graph other than the false path; and determine the circuit delay for the specified circuit based on the modified timing graph.

* * * * *